(12) United States Patent
Petrarca et al.

(10) Patent No.: US 6,339,024 B1
(45) Date of Patent: Jan. 15, 2002

(54) REINFORCED INTEGRATED CIRCUITS

(75) Inventors: Kevin S. Petrarca, Newburgh; John E. Heidenreich, III, Yorktown Heights; Judith M. Rubino, Ossining; Carlos J. Sambucetti, Croton on Hudson, all of NY (US); Richard P. Volant, New Fairfield, CT (US); George F. Walker, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/605,728

(22) Filed: Jun. 28, 2000

(51) Int. Cl.[7] .............................................. H01L 20/44
(52) U.S. Cl. ...................... 438/686; 438/238; 438/610; 438/615; 257/200; 257/270
(58) Field of Search ................................ 438/686, 610, 438/615, 238; 257/270, 200

(56) References Cited

U.S. PATENT DOCUMENTS

| | | | | |
|---|---|---|---|---|
| 4,368,573 A | * | 1/1983 | DeBrebisson et al. | ........ 29/569 |
| 5,171,711 A | * | 12/1992 | Tobimatsu | ................... 437/182 |
| 5,975,420 A | * | 11/1999 | Gogami et al. | ............. 235/492 |
| 6,076,737 A | * | 6/2000 | Gogami et al. | ............. 235/492 |
| 6,207,570 B1 | * | 3/2001 | Mucha | ........................ 438/692 |

* cited by examiner

*Primary Examiner*—Richard Elms
*Assistant Examiner*—Pho M. Luu
(74) *Attorney, Agent, or Firm*—Eric W. Petraske; Cantor Colburn LLP

(57) ABSTRACT

A method of manufacturing integrated circuits wherein a conductive structure in a topmost semiconductive layer of an integrated circuit is provided having a thickness greater than or equal to 1.5 μm. The thickness of the conductive structure is sufficiently great as to effectively protect any layers beneath the topmost semiconductive layer from damage from pressure, such as pressure applied by testing probes. In a preferred embodiment, traditional aluminum TD leveling is discarded in favor of gold deposited upon the thickened conductive layer.

4 Claims, 2 Drawing Sheets

REINFORCED INTEGRATED CIRCUITS

FIELD OF THE INVENTION

This application relates to the manufacture of integrated circuits.

BACKGROUND OF THE INVENTION

A major problem with integrated circuits (ICs) is that they are sensitive to pressure. This is a problem during manufacture of the integrated circuit (IC) because, just prior to encasing the circuit in plastic, the circuit is tested by having a set of probes pushed against critical conductive points on the top layer and measurements taken. Ironically, the very act of applying pressure through the testing probes causes damage to a percentage of the tested ICs, necessitating their rejection. The dielectrics used in semiconductors are generally structurally weak and are particularly sensitive to pressure. The problem is aggravated by the need for ever frailer dielectrics as the need for increased speed increases. Thick and strong dielectrics slow electric signals.

Another drawback with prior art ICs is the need to apply a top layer of aluminum that shorts out all of the conductive points, and then etch the layer so as to electrically connect the conductive points together correctly. This metallic (i.e., not solid-state) topmost layer, commonly referred to as the TD layer, also serves to connect the appropriate conductive points to the metal connectors, or contacts, that lead outside the plastic casing and plug into a matching IC socket.

BRIEF SUMMARY OF THE INVENTION

Disclosed is a method of manufacturing integrated circuits by introducing a thicker final solid state level with a thicker conductive structure in the final solid state level of chip manufacturing. The conductive structure in this layer, also known as the TV layer, will be at least 1.5 $\mu$m thick, thereby creating raised conductive points that have sufficient structural strength to resist the pressures of testing probes and thereby protect the lower layers from damage during IC testing.

In a preferred embodiment of the invention, the typical etched aluminum TD layer of the prior art is discarded in favor of gold deposited upon the raised copper conductive points. The gold is actually cheaper than aluminum because it can be deposited directly where desired, thereby eliminating a costly etching operation. The gold is easily spot welded for wire bonding to the IC contacts.

DETAILED DESCRIPTION OF THE INVENTION

Figure 1:
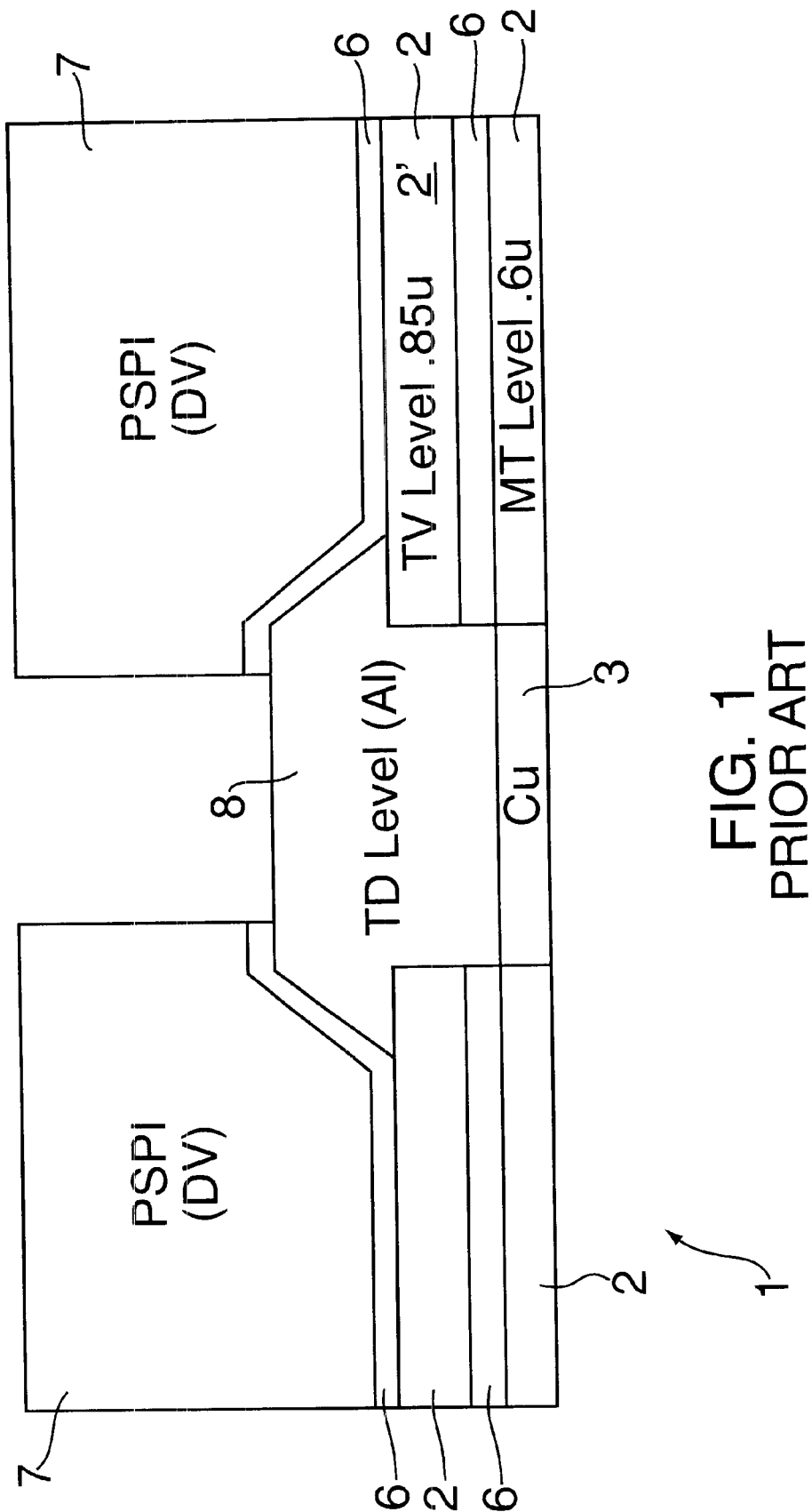
FIG. 1 illustrates an existing process of manufacturing the uppermost layer of an integrated circuit chip.

Referring initially to FIG. 1, there is depicted an existing integrated circuit (IC) "chip" 1 in cross section (without a plastic casing) comprising a plurality of semiconductive layers 2 separated by thin layers of silicon nitride 6. In the IC art, each layer includes a "front end", which refers to the actual circuitry, and a "back end", which refers to conductive structures 3 for bringing signals into and out of the layer. Generally, these conductive structures 3 will be of copper and will connect to the conductive structures of the "back ends" of immediately adjacent layers.

FIG. 1 further depicts a DV level, a TV level and an MT level, known in the art. The depiction of these particular layers in the drawings are for exemplary purposes only, it not being necessary to have these specific layers in the order or arrangement shown. Most complex ICs will have many more layers.

Also shown in FIG. 1 is a covering layer 7 that usually comprises a photosensitive polyimide polymer (PSPI) and is commonly referred to as the "DV", or covering level. This layer is not semiconductive and contains no circuitry. Below this layer is the topmost semiconductive layer, the TV level 2'. By "topmost", it is meant that in the art of IC chip manufacture, this layer is actually physically facing upward and "topmost" on the assembly line and its fabrication is usually the final step of chip manufacture before laying down of the TD (described hereinafter) and DV levels. The phrase "topmost" as used in this specification is therefore strictly a convention and not to be construed as limiting to the disclosure. The "MT" level is also an upper-level semiconductive interconnect layer.

As is known in the art, the final level of chip manufacture 3' is covered with a "TD" or conductive layer 8, usually aluminum. This layer 8 shorts out the conductive structures 3 of the final TV level 2' and must therefore be etched to correctly connect the conductive structures 3. The TD level is then spot welded to electrical connectors (not shown) that lead outside the chip's plastic casing and permit the chip to be plugged into a conventional chip socket.

Prior to laying down the TD level, the IC is usually tested by pressing electronic probes against the conductive structures 3 at critical conductive points in the back end of the final TV level 2'. Electric signals are sent through some probes as input while other probes act as detectors. By this means, the ICs can be tested and defective ICs rejected. Unfortunately, the pressure of the probes against the conductive structures 3 of the final layer 2' can itself cause damage to the back end of that layer or even those beneath it.

Figure 2:
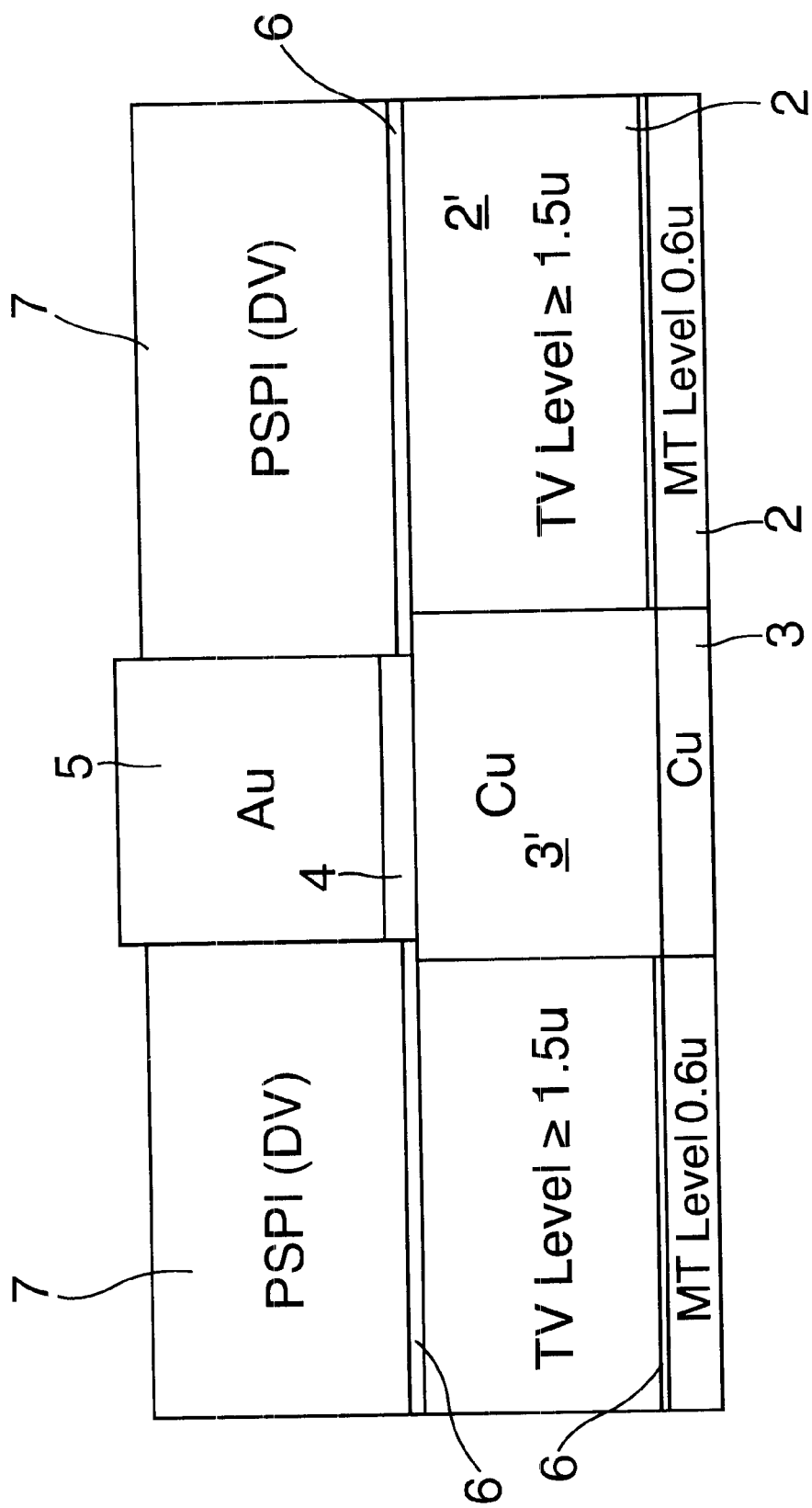
FIG. 2 illustrates a diagrammatical cross-section of a method for manufacturing integrated circuit, in accordance with an embodiment of the invention.

Therefore, in accordance with an embodiment of the invention, FIG. 2 illustrates a solution to the aforementioned drawbacks wherein a conductive structure 3' that is much thicker than that of the prior art preferably at least 1.5 $\mu$m), is used in conjunction with the thinner conductive structures 3. This imparts greater structural rigidity and thereby protects the layers beneath from probe pressure. Regardless, the actual thickness of conductive structure 3' used will depend on the structural strength of the lower layers utilized and will therefore vary according to chip design. Preferably, the conductive structure 3' will be thick enough to effectively protect the underlying layers from damage due to an expected maximum pressure to conductive structure 3'.

In a preferred embodiment of the invention, the typical aluminum TD level of the prior art is discarded in favor of a gold structure 5, comprising individual deposits of gold on conductive points of the conductive structure 3' of the TV level 2' and in electrical conduction therewith. These gold deposits penetrate through the PSPI layer 7. Before applying the gold structure 5, a diffusion barrier 4 is laid down on the conductive points in order to protect against migration of the conductive material through the gold and up to the outer surface where they may oxidize. A preferred diffusion barrier for copper conductive points is a Nickel-Phosphorous/Cobalt-Tungsten alloy.

After application of the gold, it is a straightforward manner to bond the gold to the electrical connectors and then encase the chip in plastic. The use of gold is a cost-saving measure and also imparts greater reliability because gold does not corrode as aluminum does.

Although it may seem counterintuitive that the use of gold instead of aluminum could save costs, it will be noted that the teachings of the invention eliminate the lithographic etching operation required for aluminum TD levels. The gold is applied only where needed and can be laid down in remarkably thin layers, as thin as 0.1 microns. The result is that gold is actually cheaper than aluminum.

While preferred embodiments have been shown and described, various modifications and substitutions may be made thereto without departing from the spirit and scope of the invention. Accordingly, it is to be understood that the present invention has been described by way of illustration only, and such illustrations and embodiments as have been disclosed herein are not to be construed as limiting to the claims.

What is claimed is:

1. A method of forming structurally reinforced integrated circuits, said method comprising the steps of:

forming a conductive structure in a topmost semiconductive layer of the integrated circuit;

said conductive structure having a thickness greater than or equal to 1.5 $\mu$m; and wherein said thickness of said conductive structure is sufficiently great as to effectively protect any layers beneath said topmost semiconductive layer from damage due to pressure upon said conductive structure.

2. The method of claim 1, further comprising forming a gold structure in electrical contact with said conductive structure, said gold structure in electrical communication with electrical connectors.

3. The method of claim 2, further comprising a diffusion barrier deposited between said gold structure and said conductive structure.

4. The method of claim 3, wherein said diffusion barrier comprises a nickel-phosphorus/cobalt-tungsten alloy and said conductive structure comprises copper.

* * * * *